(12) United States Patent
Cho et al.

(10) Patent No.: US 10,978,368 B2
(45) Date of Patent: Apr. 13, 2021

(54) SEMICONDUCTOR DEVICE

(71) Applicant: SAMSUNG ELECTRONICS CO., LTD., Suwon-si (KR)

(72) Inventors: Ho Sung Cho, Cheonan-si (KR); Sang Kweon Lee, Cheonan-si (KR); Sang Young Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/460,679

(22) Filed: Jul. 2, 2019

(65) Prior Publication Data

US 2020/0075450 A1 Mar. 5, 2020

(30) Foreign Application Priority Data

Aug. 30, 2018 (KR) .................... 10-2018-0102533

(51) Int. Cl.
*H01L 21/78* (2006.01)
*H01L 23/31* (2006.01)
*H01L 23/00* (2006.01)

(52) U.S. Cl.
CPC .......... *H01L 23/3192* (2013.01); *H01L 21/78* (2013.01); *H01L 24/02* (2013.01); *H01L 24/13* (2013.01); *H01L 2224/0236* (2013.01); *H01L 2224/02313* (2013.01); *H01L 2224/13024* (2013.01)

(58) Field of Classification Search
None
See application file for complete search history.

(56) References Cited

U.S. PATENT DOCUMENTS

| 6,777,772 B1* | 8/2004 | Taya ...................... H01L 21/78 257/301 |
| 7,741,196 B2 | 6/2010 | Yip et al. |
| 8,125,053 B2 | 2/2012 | West et al. |
| 8,692,357 B2 | 4/2014 | Ning |
| 2001/0015476 A1* | 8/2001 | Tada ................... H01L 23/3171 257/620 |
| 2003/0160303 A1 | 8/2003 | Hirokawa et al. |

(Continued)

FOREIGN PATENT DOCUMENTS

| JP | 11-340167 A | 12/1999 |
| JP | 3339485 B2 | 10/2002 |

(Continued)

*Primary Examiner* — Benjamin P Sandvik
(74) *Attorney, Agent, or Firm* — Sughrue Mion, PLLC

(57) ABSTRACT

A semiconductor device is provided. The semiconductor device includes a substrate, an insulating film, and a photo sensitive film. The substrate includes a semiconductor chip region and a scribe line region disposed along an edge of the semiconductor chip region. The insulating film includes a first portion disposed on the semiconductor chip region, a second portion disposed on the scribe line region and connected with the first portion, and a third portion disposed on the scribe line region and protruded in a first direction from the second portion. The photo sensitive film is disposed on the insulating film and has a sidewall exposed on the second portion of the insulating film. A first width of the third portion in a second direction perpendicular to the first direction decreases as a distance from the semiconductor chip region increases.

20 Claims, 20 Drawing Sheets

(56) References Cited

U.S. PATENT DOCUMENTS

| | | | |
|---|---|---|---|
| 2010/0320612 A1* | 12/2010 | Uchida | H01L 21/78 |
| | | | 257/773 |
| 2013/0192078 A1* | 8/2013 | Yoshimi | H01L 22/12 |
| | | | 33/701 |
| 2013/0341800 A1* | 12/2013 | Tu | H01L 23/585 |
| | | | 257/774 |
| 2019/0371742 A1* | 12/2019 | Utsunomiya | H01L 23/562 |
| 2020/0051932 A1* | 2/2020 | Han | H01L 23/3171 |
| 2020/0126932 A1* | 4/2020 | Kim | H01L 23/585 |

FOREIGN PATENT DOCUMENTS

| | | |
|---|---|---|
| JP | 4407800 B2 | 2/2010 |
| JP | 2010-56204 A | 3/2010 |
| JP | 2013-62372 A | 4/2013 |
| JP | 6296913 B2 | 3/2018 |
| KR | 2002-0036038 A | 5/2002 |

* cited by examiner

SEMICONDUCTOR DEVICE

This application claims priority to Korean Patent Application No. 10-2018-0102533, filed on Aug. 30, 2018 in the Korean Intellectual Property Office, and all the benefits accruing therefrom under 35 U.S.C. § 119, the disclosure of which is incorporated by reference herein in its entirety.

BACKGROUND

1. Technical Field

The present disclosure relates to a semiconductor device.

2. Description of the Related Art

Recently, a semiconductor device is advancing in miniaturization and high performance. Accordingly, a low-k insulating film may be used in the semiconductor device.

When the semiconductor device is cut off for packaging of the semiconductor device, physical stress may be applied to the semiconductor device. Meanwhile, when a low-k insulating film is used in the semiconductor device, a peeling phenomenon of wires disposed under the low-k insulating film may occur.

SUMMARY

It is an aspect to provide a semiconductor device having enhanced reliability as an open region having a cutting edge is formed within an insulating film along a scribe line on a scribe line region, which prevents a peeling phenomenon and a crack fault of a semiconductor chip.

According to an exemplary embodiment of the present disclosure, there is provided a semiconductor device, comprising a substrate comprising a semiconductor chip region and a scribe line region disposed along an edge of the semiconductor chip region, an insulating film comprising a first portion disposed on the semiconductor chip region, a second portion disposed on the scribe line region and connected with the first portion, and a third portion disposed on the scribe line region and protruded in a first direction from the second portion, and a photo sensitive film disposed on the insulating film and having an exposed sidewall exposed on the second portion, wherein a first width of the third portion in a second direction perpendicular to the first direction decreases as a distance from the semiconductor chip region increases.

According to an exemplary embodiment of the present disclosure, there is provided a semiconductor device, comprising a substrate comprising a semiconductor chip region and a scribe line region disposed along an edge of the semiconductor chip region, an insulating film comprising a first portion disposed on the semiconductor chip region, a second portion disposed on the scribe line region and connected with the first portion, and a third portion disposed on the scribe line region and protruded in a first direction from the second portion, a first open region defined by a first sidewall of the second portion and a second sidewall of the third portion on the scribe line region, a photo sensitive film disposed on the insulating film and having an exposed sidewall exposed on the second portion, and a second open region defined by the insulating film and the exposed sidewall of the photo sensitive film on the first open region, wherein a first width in a second direction perpendicular to the first direction of the first open region increases as a distance from the semiconductor chip region increases.

According to an exemplary embodiment of the present disclosure, there is provided a semiconductor device, comprising a substrate comprising a semiconductor chip region and a scribe line region disposed along an edge of the semiconductor chip region, an insulating film comprising a first portion disposed on the semiconductor chip region, a second portion disposed on the scribe line region and connected with the first portion, and a third portion disposed on the scribe line region and protruded in a first direction from the second portion, a photo sensitive film comprising a fourth portion disposed on the first portion of the insulating film, a fifth portion disposed on the second portion of the insulating film, and a sixth portion protruded in the first direction from the fifth portion, and a base substrate disposed on the photo sensitive film, wherein a first width of the third portion in a second direction perpendicular to the first direction decreases as a distance from the semiconductor chip region increases.

The objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other aspects will become more apparent to those of ordinary skill in the art by describing in detail exemplary embodiments thereof with reference to the accompanying drawings, in which.

DETAILED DESCRIPTION

Hereinbelow, a semiconductor device according to some exemplary embodiments will be described with reference to FIG. 1 to FIG. 3. In the present disclosure, the phrase "at least one of A and B" includes "only A", "only B", and "both A and B".

Figure 1:
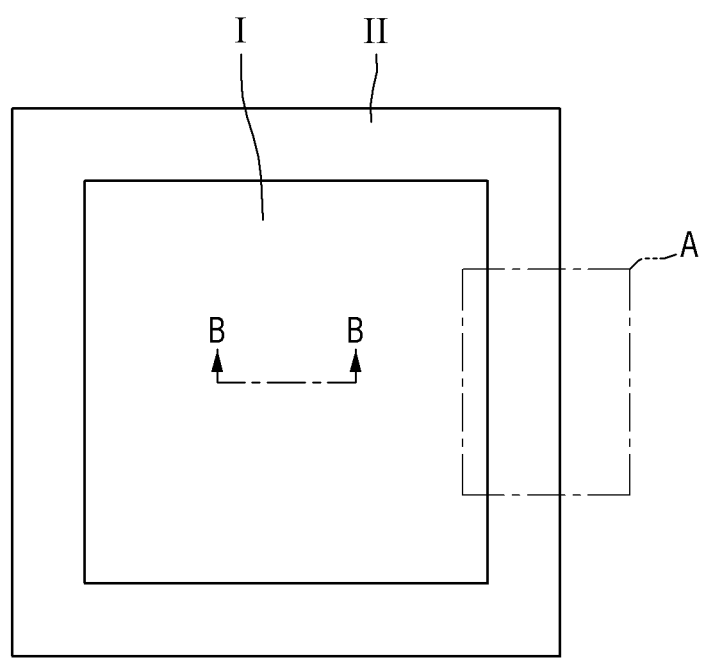
FIG. 1 is a top view provided to explain a semiconductor device according to some exemplary embodiments.
Figure 1:
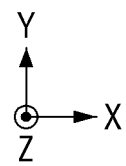

FIG. 1 is a top view provided to explain a semiconductor device according to some exemplary embodiments; FIG. 2 is an enlargement view of a region A in FIG. 1; FIG. 3 is a cross-sectional view taken on lines B-B of FIG. 1, C-C and D-D of FIG. 2; FIG. 1 and FIG. 2 do not illustrate a base substrate 190 for convenience of explanation.

Figure 2:
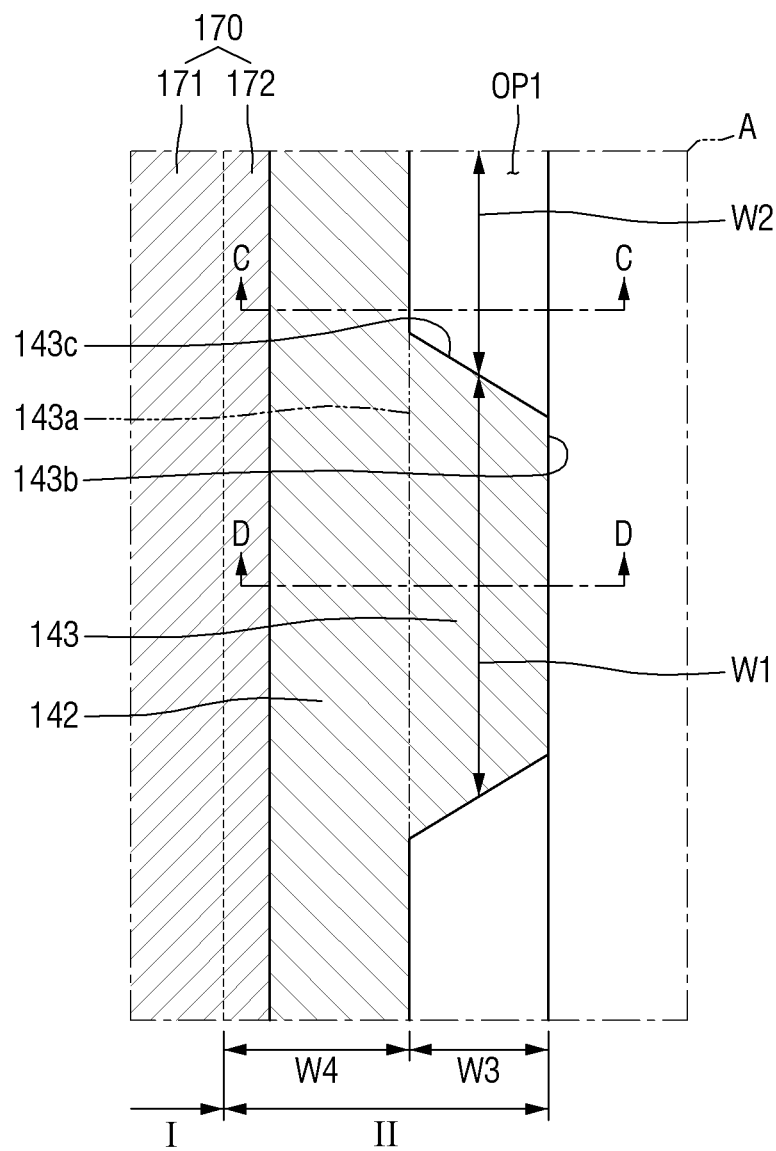
FIG. 2 is an enlargement view of a region A in FIG. 1.
Figure 3:
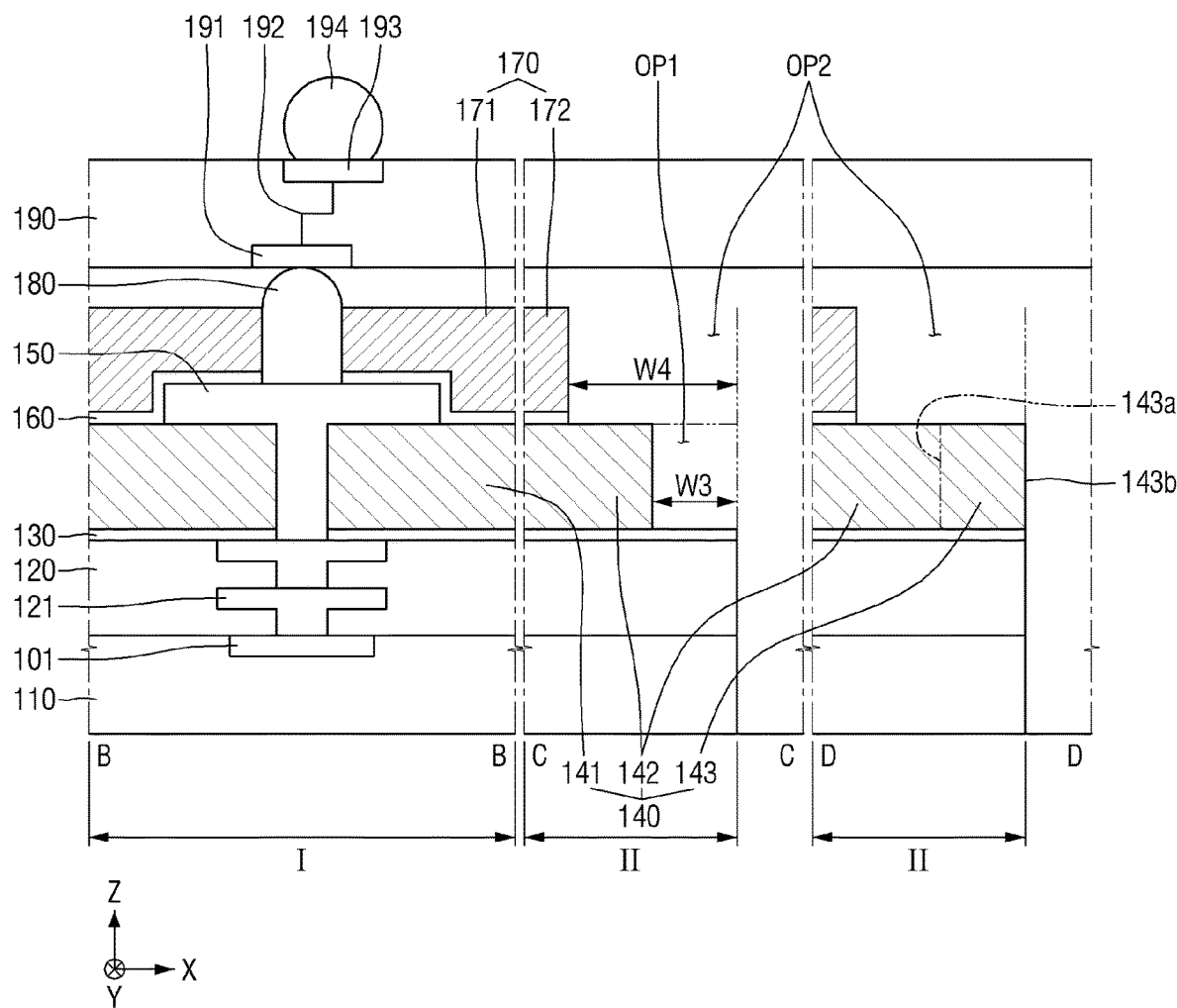
FIG. 3 is a cross-sectional view taken on lines B-B of FIG. 1, and C-C and D-D of FIG. 2.

Referring to FIG. 1 to FIG. 3, the semiconductor device according to some exemplary embodiments may include a substrate 110, a first insulating film 120, an etch stop film 130, a second insulating film 140, a rewire layer 150, a passivation film 160, a photo sensitive film 170, a connection terminal 180 and a base substrate 190.

The substrate 110 may be a structure in which the base substrate and an epi-layer are stacked one on the other, but the present disclosure is not limited thereto. The substrate 110 may be, for example, a silicon substrate, a gallium arsenide substrate, a silicon germanium substrate, a ceramic substrate, a quartz substrate, or a glass substrate for display, or a semiconductor on insulator (SOI) substrate. Hereinbelow, the silicon substrate will be described as an example. Further, the substrate 110 may have a configuration in which the insulating film is formed on the silicon substrate.

The substrate 110 may include a semiconductor chip region I and a scribe line region II.

A semiconductor chip may be disposed on the semiconductor chip region I. The semiconductor chip may be, for example, a memory chip, a logic chip, and so on. When the semiconductor chip is a logic chip, various logic gates or logic configurations may be formed in consideration of the calculation to be carried out by the logic of the logic chip. When the semiconductor chip is the memory chip, the memory chip may be, for example, a non-volatile memory chip. Specifically, the memory chip may a flash memory chip. More specifically, the memory chip may be any one of a NAND flash memory chip or a NOR flash memory chip. Meanwhile, a memory device according to the present disclosure is not limited to the specific configuration exemplified above. According to some exemplary embodiments of the present disclosure, the memory chip may include any one of a phase-change random-access memory (PRAM), a magneto-resistive random-access memory (MRAM), or a resistive random-access memory (RRAM).

The scribe line region II may be disposed along an edge of the semiconductor chip region I. The scribe line region II may include a scribe line SL of FIG. 4. The scribe line SL may be a line for cutting the substrate 110 during the fabrication process of the semiconductor device.

The substrate 110 may include a semiconductor chip wire 101. The semiconductor chip wire 101 may be disposed, for example, on the semiconductor chip region I. The semiconductor chip wire 101 is a metal wire in the semiconductor device according to some exemplary embodiments. However, this is for convenience of explanation only, and the present disclosure is not limited thereto. It is of course possible that the semiconductor chip wire 101 may be a transistor, a diode, and so on formed within the substrate 110, and for example, be a gate electrode of the transistor or a source/drain of the transistor.

The first insulating film 120 may be disposed on the substrate 110. The first insulating film 120 may be disposed across the semiconductor chip region I and the scribe line region II. The first insulating film 120 may cover a front surface of the substrate 110, for example.

The first insulating film 120 may include a low-k material having a lower dielectric constant than a silicon oxide film. The first insulating film 120 may have a dielectric constant of about 1.0 to about 3.0, and may include at least one of organic, inorganic, and organic-inorganic hybrid material. Further, the first insulating film 120 may be porous or nonporous. The first insulating film 120 may be, for example, formed of silicon oxide series material doped with impurities or formed of an organic polymer having a low-k.

The oxide series material doped with impurities may be, for example, fluorine-doped oxide (FSG), carbon-doped oxide, silicon oxide, hydrogen silsesquioxane (SiO:H), methyl silsesquioxane (SiO:CH3), a-SiOC (SiOC:H), and so on. Organic polymer having a low-k may be, for example, polyallylether resin, ring fluorine resin, siloxane copolymer, polyallylether fluride resin, polypentafluorostylene, polytetrafluorostyrene resin, polyimide fluride resin, polynaphthalene fluride, polycide resin and so on.

Although it is illustrated in FIG. 3 that the first insulating film 120 is a single film, the present disclosure is not limited thereto. For example, the first insulating film 120 may include insulating films stacked in a third direction Z and barrier films disposed between each of the insulating films stacked in the third direction Z. The barrier film may include, for example, insulating material such as SiN, SiON, SiC, SiCN, SiOCH film, SiOC and SiOF.

A wire structure 121 may be in electrical contact with the semiconductor chip wire 101. The wire structure 121 may include a via to electrically connect between a plurality of wires and between a lowest wire among a plurality of wires and the semiconductor chip wire 101, respectively.

Although it is illustrated in FIG. 3 that a sidewall of the via has a perpendicular inclination in the third direction Z, the present disclosure is not limited thereto. For example, it is of course possible that a sidewall of the via may extend toward the wire at a random inclination from the semiconductor chip wire 101. The wire structure 121 may include a conductive material.

The etch stop film 130 may be disposed on the first insulating film 120. The etch stop film 130 may be disposed across the semiconductor chip region I and the scribe line region II.

The etch stop film 130 may include an insulating material that has an etch selectivity to the first insulating film 120. The etch stop film 130 may include, for example, silicon nitride, silicon oxynitride, silicon carbonitride, and so on.

The second insulating film 140 may be disposed on the etch stop film 130. The second insulating film 140 may be disposed across the semiconductor chip region I and the scribe line region II.

The second insulating film 140 may include a first portion 141 disposed on the semiconductor chip region I, a second portion 142 disposed on the scribe line region II and connected with the first portion 141, and a third portion 143 disposed on the scribe line region II and protruded from the second portion 142 in a first direction X.

The third portion 143 of the second insulating film 140 may include a first surface 143a in contact with the second portion 142 of the second insulating film 140, a second surface 143b opposed to the first surface 143a, and a third surface 143c connecting the first surface 143a and the second surface 143b (see FIG. 2). The third surface 143c of the third portion 143 of the second insulating film 140 may have, for example, a flat plane shape as illustrated in FIG. 2. However, the present disclosure is not limited thereto.

A width W1 in a second direction Y perpendicular to the first direction X of the third portion 143 of the second insulating film 140 may decrease as a distance from the semiconductor chip region I increases. That is, the third surface 143c of the third portion 143 of the second insulating film 140 may be formed to have an acute angle with a hypothetical line extending in the first direction X.

The second insulating film 140 may include a first open region OP1 formed on the scribe line region II. The first open region OP1 may be defined by a sidewall of the second portion 142 of the second insulating film 140 and a sidewall of the third portion 143 of the second insulating film 140 on the scribe line region II.

A portion of an upper surface of the etch stop film 130 may be exposed by the first open region OP1. However, the present disclosure is not limited thereto. That is, according to some other exemplary embodiments, a portion of an upper surface of the first insulating film 120 may be exposed by the first open region OP1.

A width W2 in the second direction Y of the first open region OP1 may increase as a distance from the semiconductor chip region I increases. That is, the width W2 in the second direction Y of the first open region OP1 may increase as a distance to the second surface 143b of the third portion 143 of the second insulating film 140 decreases.

A width W3 in the first direction X of the first open region OP1 exposing a sidewall of the second portion 142 of the second insulating film 140 may be formed to be regular. A width in the first direction X of the first open region OP1 exposing a sidewall of the third portion 143 of the second insulating film 140 may decrease as a distance to the second surface 143b of the third portion 143 of the second insulating film 140 decreases.

A shape on X-Y plane of the first open region OP1 may have a trapezoid shape having a cutting edge on a portion in contact with the second surface 143b of the third portion 143 of the second insulating film 140.

The second insulating film 140 may include a different insulating material from the first insulating film 120. For example, the second insulating film 140 may include tetraethylorthosilicate (TEOS). However, the present disclosure is not limited thereto.

The rewire layer 150 may be disposed on the semiconductor chip region I. A portion of the rewire layer 150 may extend within the first portion 141 of the second insulating film 140 and the etch stop film 130. The remaining portion of the rewire layer 150 may be disposed on the first portion 141 of the second insulating film 140. The rewire layer 150 may be electrically connected with the wire structure 121. The rewire layer 150 may be disposed between the wire structure 121 and the connection terminal 180.

Although it is illustrated in FIG. 3 that a sidewall of a portion of the rewire layer 150 extending within the first portion 141 of the second insulating film 140 and the etch stop film 130 has a perpendicular inclination, the present disclosure is not limited thereto. That is, according to some other exemplary embodiments, a sidewall of the rewire layer 123 has a random inclination and may extend toward the passivation film 160 from the wire structure 121.

The rewire layer 150 may include, for example, at least one of a metal or a metal alloy selected from a group comprised of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

The passivation film 160 may be disposed on the first portion 141 of the second insulating film 140 and the rewire layer 150. The passivation film 160 may be disposed across the semiconductor chip region I and the scribe line region II.

A portion of the passivation film 160 may extend on the second portion 142 of the second insulating film 140. That is, a sidewall of the passivation film 160 may be exposed on the second portion 142 of the second insulating film 140.

The passivation film 160 may expose a remaining portion of the second portion 142 of the second insulating film 140 and the first open region OP1. Further, the passivation film 160 may expose a portion of the rewire layer 150.

The passivation film 160 may be, for example, a silicon nitride film or a silicon oxynitride film.

The photo sensitive film 170 may be disposed to overlap the passivation film 160 on the passivation film 160. The photo sensitive film 170 may be disposed across the semiconductor chip region I and the scribe line region II.

The photo sensitive film 170 may include a fourth portion 171 disposed on the first portion 141 of the second insulating film 140 and a fifth portion 172 disposed on the second portion 142 of the second insulating film 140. The fifth portion 172 of the photo sensitive film 170 may be formed to be connected with the fourth portion 171 of the photo sensitive film 170.

A sidewall of the fifth portion 172 of the photo sensitive film 170 may be exposed on the second portion 142 of the second insulating film 140.

The photo sensitive film 170 may expose a remaining portion of the second portion 142 of the second insulating film 140 and the first open region OP1. Further, the photo sensitive film 170 may expose a portion of the rewire layer 150.

The photo sensitive film 170 may include a second open region OP2 formed on the scribe line region II. The second open region OP2 may be formed on the second portion 142 of the second insulating film 140 and the first open region OP1. The second open region OP2 may be defined by a sidewall of the fifth portion 172 of the photo sensitive film 170 on the scribe line region II.

A portion of the second portion 142 of the second insulating film 140 and the first open region OP1 may be exposed by the second open region OP2.

A sidewall of the fifth portion 172 of the photo sensitive film 170 may be formed to extend in the second direction Y. That is, a width W4 in the first direction X of the second open region OP2 may be formed to be regular along the second direction Y. However, the present disclosure is not limited thereto.

The width W4 in the first direction X of the second open region OP2 may be formed to be greater than the width W3 in the first direction X of the first open region OP1.

The photo sensitive film 170 may include, for example, any one of photo sensitive polyimide (PSPI), polyimide (PI), and photo sensitive polyhydroxystyrene; however, the present disclosure is not limited thereto.

The connection terminal 180 may be disposed, for example, on the semiconductor chip region I. A portion of the connection terminal 180 may penetrate through the photo sensitive film 170 and the passivation film 160 and extend in the third direction Z so as to be in contact with the rewire layer 150. The connection terminal 180 may be protruded in the third direction Z from an upper surface of the photo sensitive film 170, for example.

The connection terminal 180 may electrically connect the rewire layer 150 and the base substrate 190.

The base substrate 190 may be disposed on the connection terminal 180. The base substrate 190 may be disposed across the semiconductor chip region I and the scribe line region II.

The base substrate 190 may include a first pad 191, a connection wire 192, a second pad 193, and an external connection terminal 194.

The external connection terminal 194 may be disposed on an upper surface of the base substrate 190. The first pad 191 may be electrically connected with the connection terminal 180 as being disposed on a lower surface of the base substrate 190. The second pad 193 may be electrically connected with the external connection terminal 194 as being disposed on an upper surface of the base substrate 190. The connection wire 192 may electrically connect the between the first pad 191 and the second pad 193 as being disposed within the base substrate 190.

Although it is illustrated in FIG. 3 that an upper surface of the base substrate 190 and an upper surface of the first pad 191 are formed on a same plane and a lower surface of the base substrate 190 and a lower surface of the second pad 193 are formed on a same plane, the present disclosure is not limited thereto. That is, according to some other exemplary embodiments, the first pad 191 may be formed to be protruded from an upper surface of the base substrate 190 and the second pad 193 may be formed to be protruded from a lower surface of the base substrate 190.

The base substrate 190 may be a package substrate, and may be, for example, a printed circuit board (PCB), a ceramic substrate, and so on.

The semiconductor device according to some exemplary embodiments may fit a portion concentrated with stress applied on the substrate 110 during a cutting process of the substrate 110 to a cutting edge of the first open region OP1 by forming the first open region OP1 having a cutting edge in the second direction Y within the second insulating film 140 on the scribe line region II. As a result, reliability of the semiconductor device may be enhanced by preventing a peeling phenomenon and a crack fault of the semiconductor chip in securing straightness in a cutting process of the substrate 110.

Hereinafter, a method for fabricating a semiconductor device according to some exemplary embodiments will be described with reference to FIG. 1 to FIG. 12.

FIG. 4 to FIG. 12 are views illustrating intermediate stages of fabrication, provided to explain a method for fabricating a semiconductor device according to some exemplary embodiments.

Figure 4:
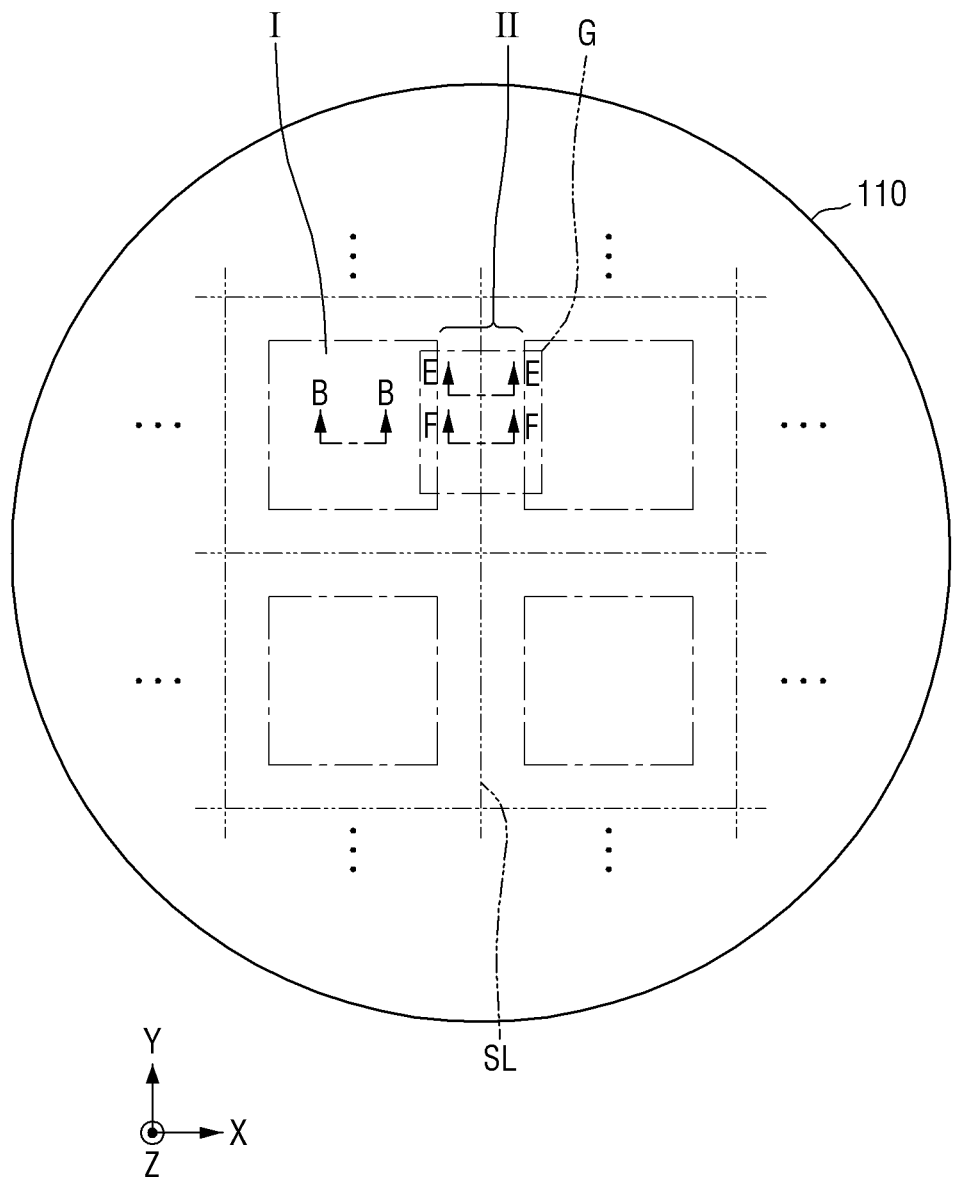
FIG. 4 to FIG. 12 are views illustrating intermediate stages of fabrication, provided to explain a method for fabricating a semiconductor device according to some exemplary embodiments.

Referring to FIG. 4, the semiconductor chip region I and the scribe line region II may be defined on the substrate 110. The scribe line region II may be defined so as to be disposed along an edge of the semiconductor chip region I. The substrate 110 may include a semiconductor chip wire 101 formed therewithin.

The scribe line SL may be formed so as to pass through a center of the scribe line region II.

The scribe line SL may indicate a line of cutting the substrate 110 in a subsequent cutting process of the substrate 110. The process of cutting the substrate 110 along the scribe line SL may be performed by using, for example, a blade or a razer. The following will be described in consideration of using a razer in the substrate cutting process.

Figure 5:
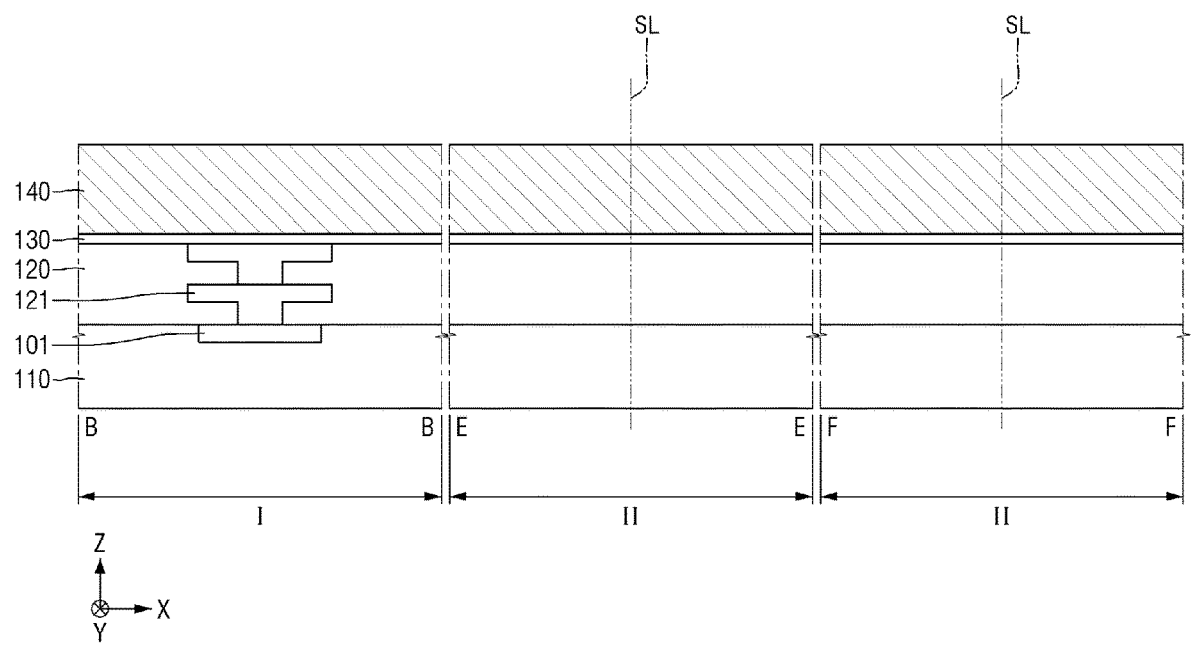

Referring to FIG. 5, the first insulating film 120 including the wire structure 121 may be formed on the substrate 110. Next, the etch stop film 130 and the second insulating film 140 may be sequentially stacked.

Each of the first insulating film 120, the etch stop film 130, and the second insulating film 140 may be formed on the semiconductor chip region I and the scribe line region II.

Figure 6:
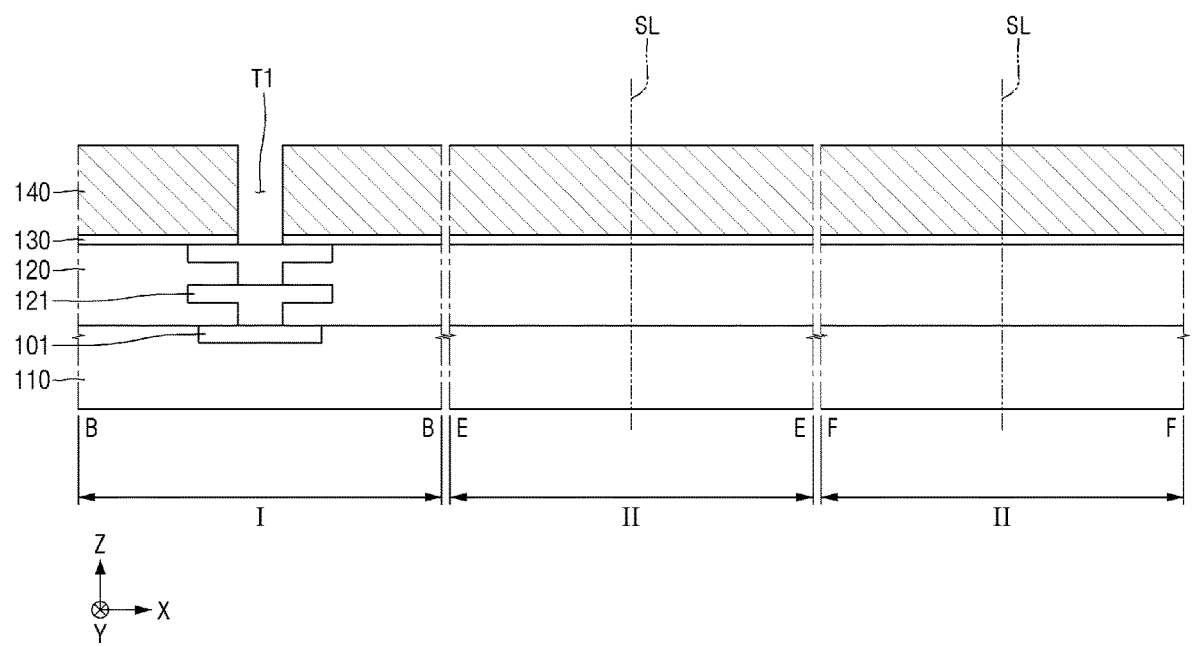

Referring to FIG. 6, a first trench T1 may be formed on the semiconductor chip region I. For example, a portion of the second insulating film 140 formed on the semiconductor chip region I and a portion of the etch stop film 130 formed on the semiconductor chip region I may be removed. The wire structure 121 may be exposed by the first trench T1.

Figure 7:
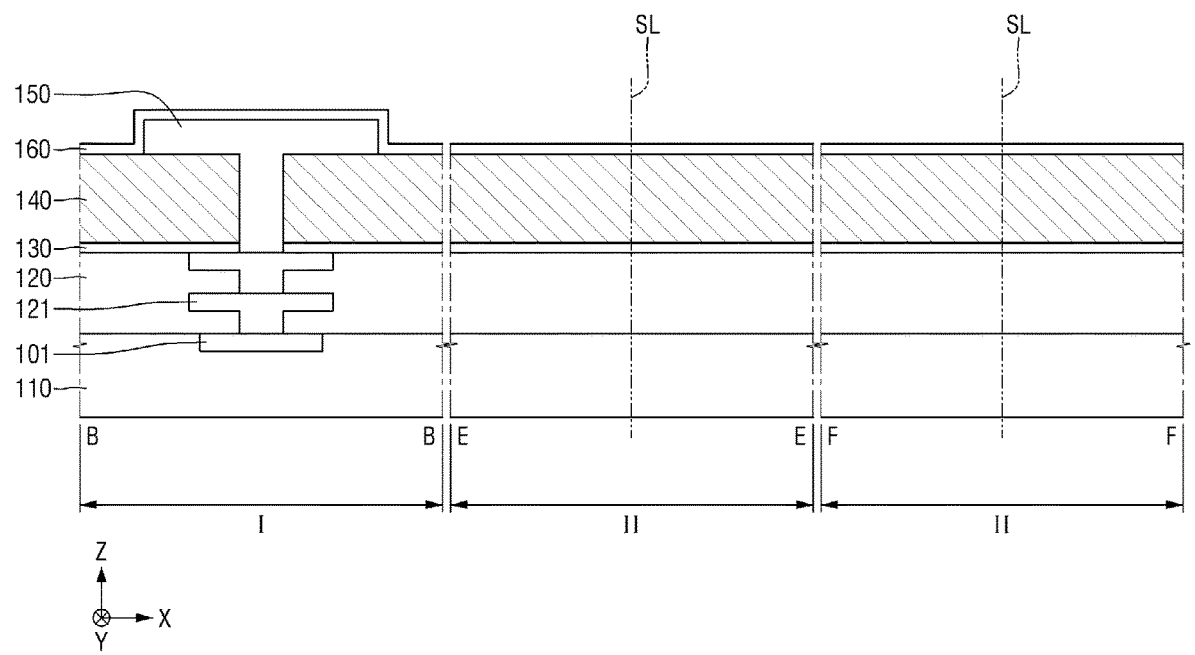

Referring to FIG. 7, the rewire layer 150 and the passivation film 160 may be sequentially formed on the second insulating film 140.

Specifically, the rewire layer 150 may be formed to fill the first trench T1. Further, the rewire layer 150 may be formed on an upper surface of the second insulating film 140 as well. The rewire layer 150 may be formed on the semiconductor chip region I.

The passivation film 160 may be formed to overlie an upper surface of the second insulating film 140 and the rewire layer 150. The passivation film 160 may be formed across the semiconductor chip region I and the scribe line region II.

Figure 8:
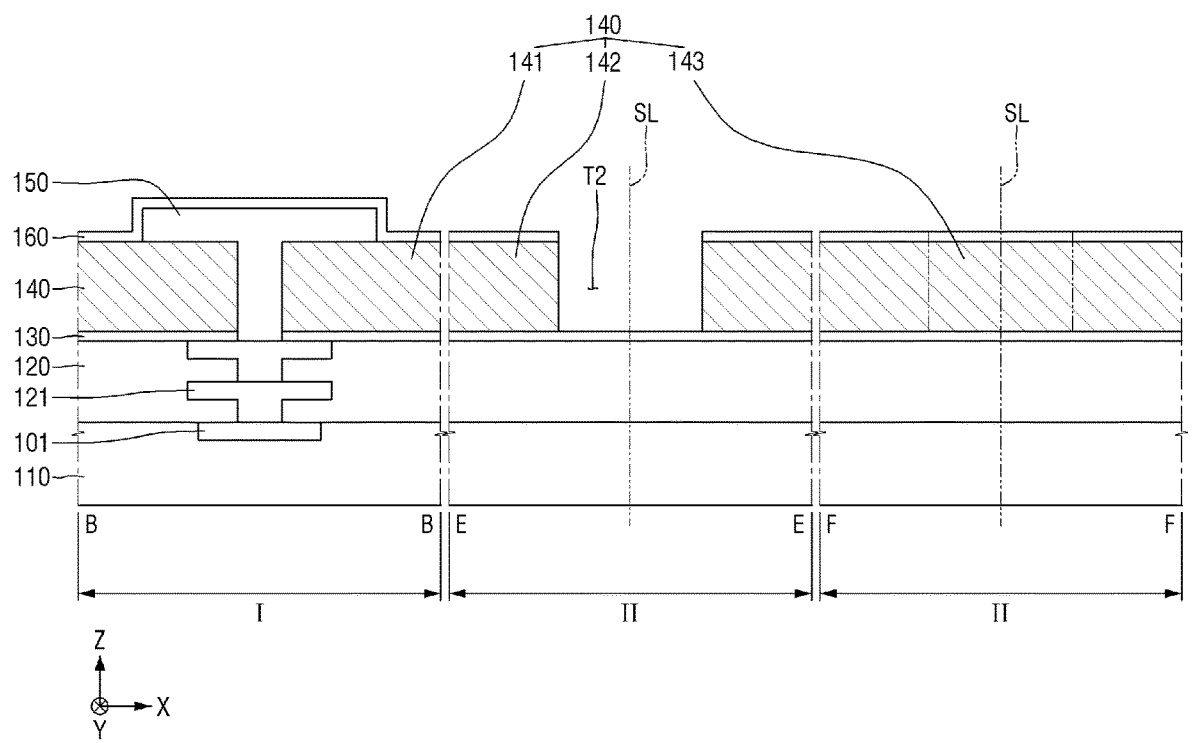

Referring to FIG. 8, a second trench T2 may be formed on the scribe line region II. Specifically, the second trench T2 may be formed within the second insulating film 140 as a portion of the passivation film 160 and a portion of the second insulating film 140, which are formed on the scribe line region II, are removed.

A sidewall of the second insulating film 140 may be exposed by the second trench T2. Further, an upper surface of the etch stop film 130 may also be exposed by the second trench T2, as shown in FIG. 8. However, the present disclosure is not limited thereto. That is, an upper surface of the first insulating film 120 may be exposed as the etch stop film 130 is etched during a forming process of the second trench T2 according to some other exemplary embodiments.

Figure 11:
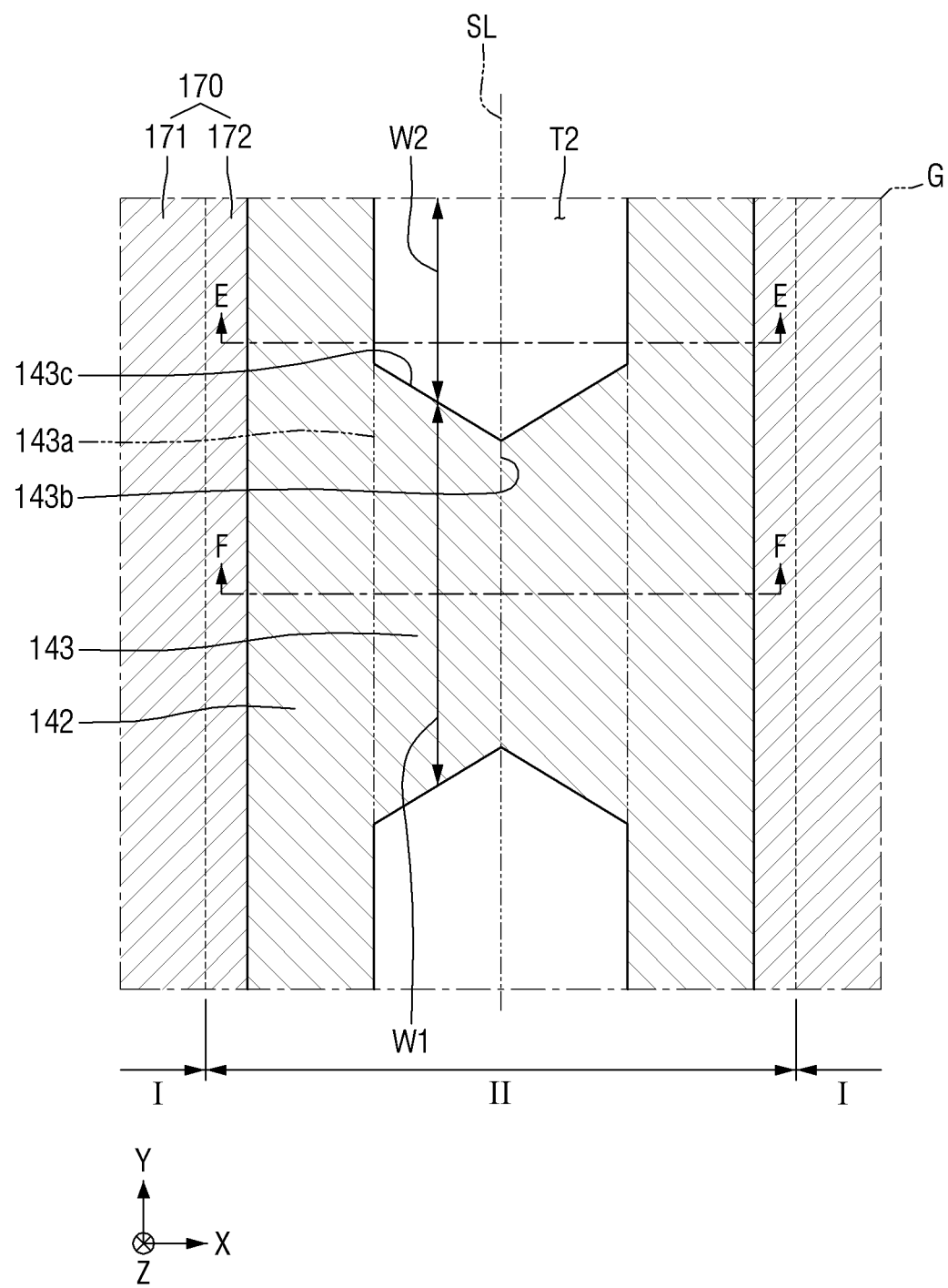

The second trench T2 may be formed to have a cutting edge shape protruded in the second direction Y along the scribe line SL on X-Y plane, as illustrated in FIG. 11.

For convenience of explanation, the following defines the second insulating film 140 formed on the semiconductor chip region I as the first portion 141, the second insulating film 140 connected with the first portion 141 and formed on the scribe line region II as the second portion 142, and the second insulating film 140 overlapping the second trench T2 in the second direction Y and formed on the scribe line region II so as to be protruded in the first direction X from the second portion 142 as the third portion 143.

Figure 9:
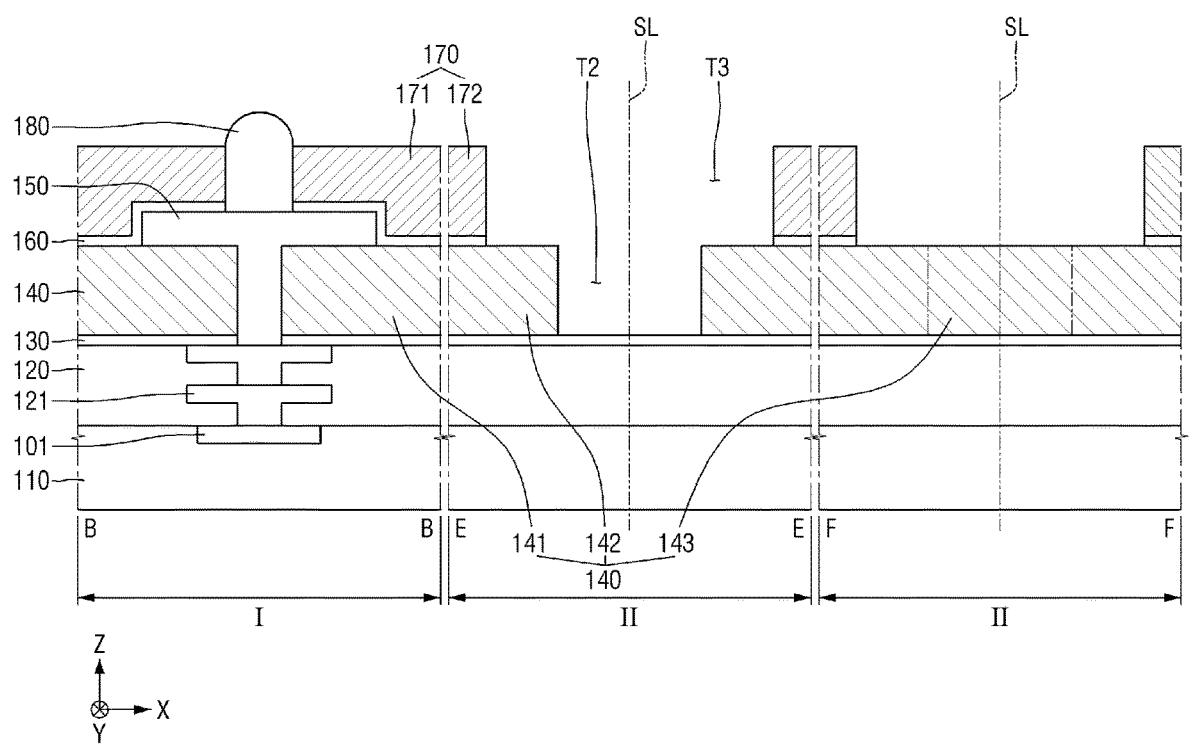

Referring to FIG. 9, the photo sensitive film 170 including a third trench T3 may be formed on the passivation film 160. Specifically, the photo sensitive film 170 formed on a portion of the second portion 142 of the second insulating film 140 and the third portion 143 of the second insulating film 140 may be removed.

Further, the passivation film 160 formed on a portion of the second portion 142 of the second insulating film 140 and the third portion 143 of the second insulating film 140 may also be removed.

Through the removing process described above, the photo sensitive film 170 including the third trench T3 formed on a portion of the second portion 142 of the second insulating film 140 and the second trench T2 may be formed.

A sidewall of the photo sensitive film 170 may be exposed on the second portion 142 of the second insulating film 140 by the third trench T3.

Further, the connection terminal 180 may be formed on the trench formed by removing a portion of the passivation film 160 and a portion of the photo sensitive film 170 formed on the rewire layer 150.

The photo sensitive film 170 may include a fourth portion 171 formed on the semiconductor chip region I and a fifth portion 172 formed on the scribe line region II. The fifth portion 172 of the photo sensitive film 170 may be defined as a portion extending in the first direction X by being connected with the fourth portion 171 of the photo sensitive film 170.

Figure 10:
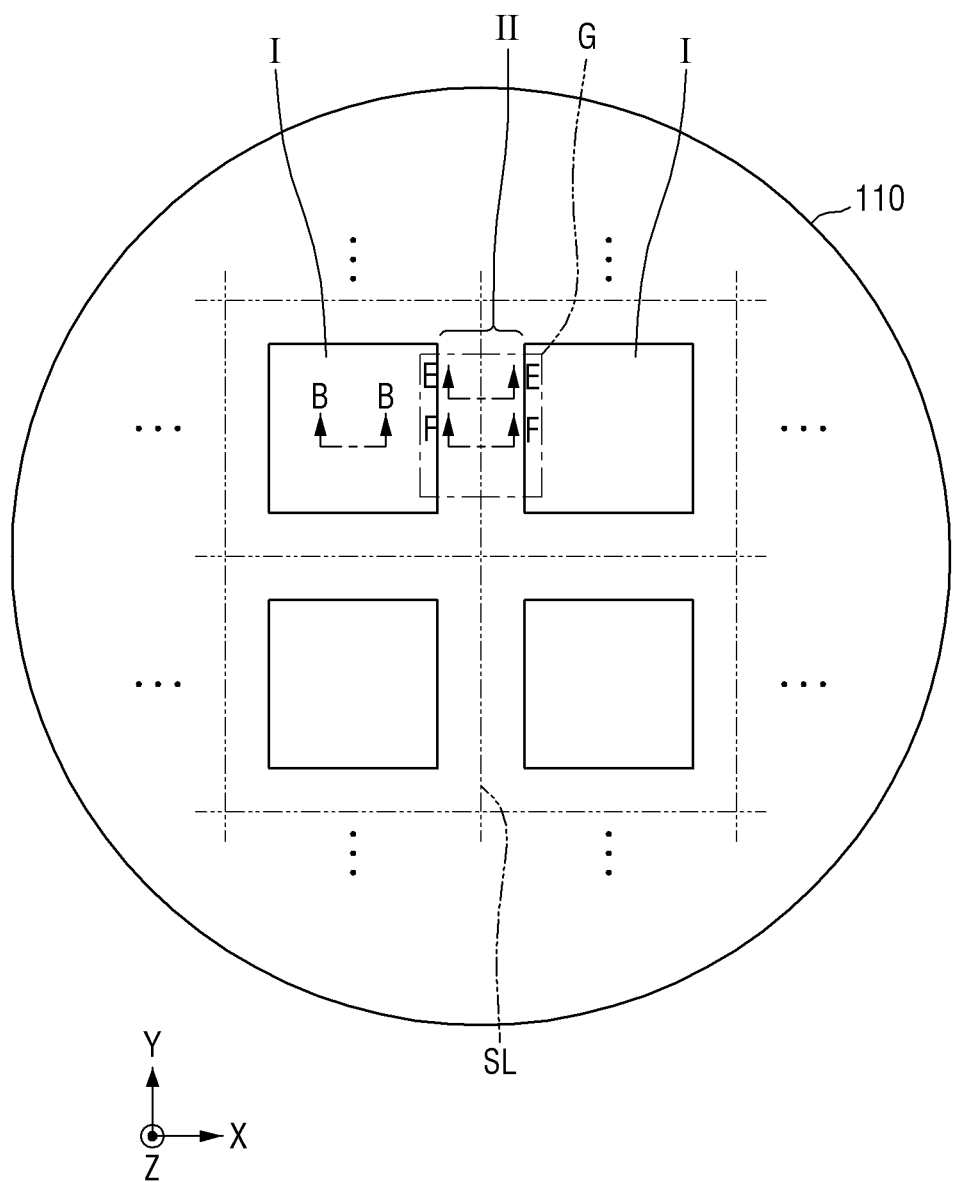

FIG. 10 and FIG. 11 illustrate a flat plane shape of the semiconductor device formed according to the above described processes.

Referring to FIG. 10 and FIG. 11, the second trench T2 having a cutting edge protruded in the second direction Y along the scribe line SL extending in the second direction Y may be formed to expose a third surface 143c of the third portion 143 of the second insulating film 140 on the scribe line region II. In this case, the second trench T2 may be formed so that the width W2 in the second direction Y of the second trench T2 may increase as a distance to the scribe line SL decreases.

Although it is illustrated in FIG. 11 that the cutting edges of the two second trenches T2 face with each other, the present disclosure is not limited thereto.

A third trench T3 may be formed to expose a portion of the second portion 142 of the second insulating film 140, the third portion 143 of the second insulating film 140 and the first trench T1. In this case, the third trench T3 may be formed to have a regular width in the first direction X, but the present disclosure is not limited thereto.

Figure 12:
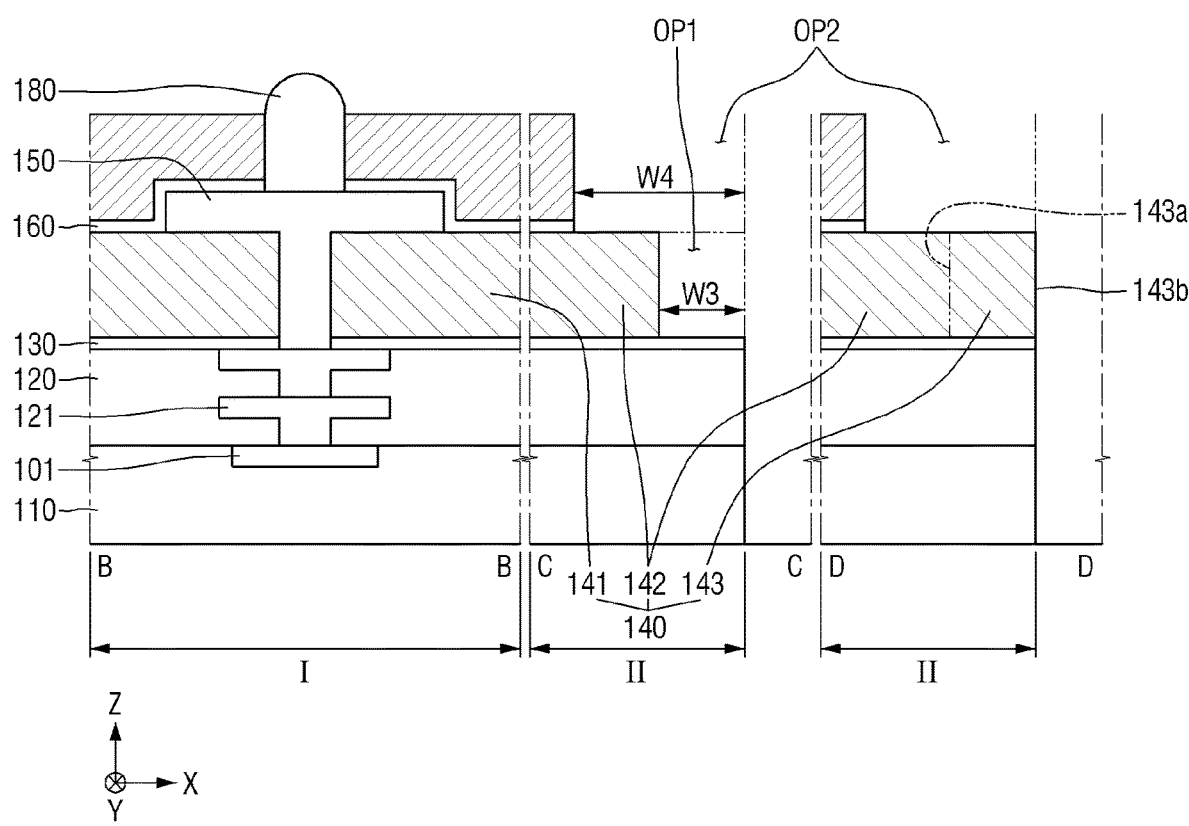

Referring to FIG. 1, FIG. 2 and FIG. 12, the substrate 110 may be cut along the scribe line SL illustrated in FIG. 11. As a result, a flat plane shape of the semiconductor device illustrated in FIG. 1 and FIG. 2 may be fabricated.

Next, the base substrate 190 may be formed to be electrically connected with the connection terminal 180 on the connection terminal 180.

Through the above-described processes, the semiconductor device illustrated in FIG. 3 may be fabricated.

Hereinbelow, a semiconductor device according to some other exemplary embodiments will be described with reference to FIG. 13 and FIG. 14. The difference from the semiconductor devices illustrated in FIG. 2 and FIG. 3 will be highlighted.

Figure 13:
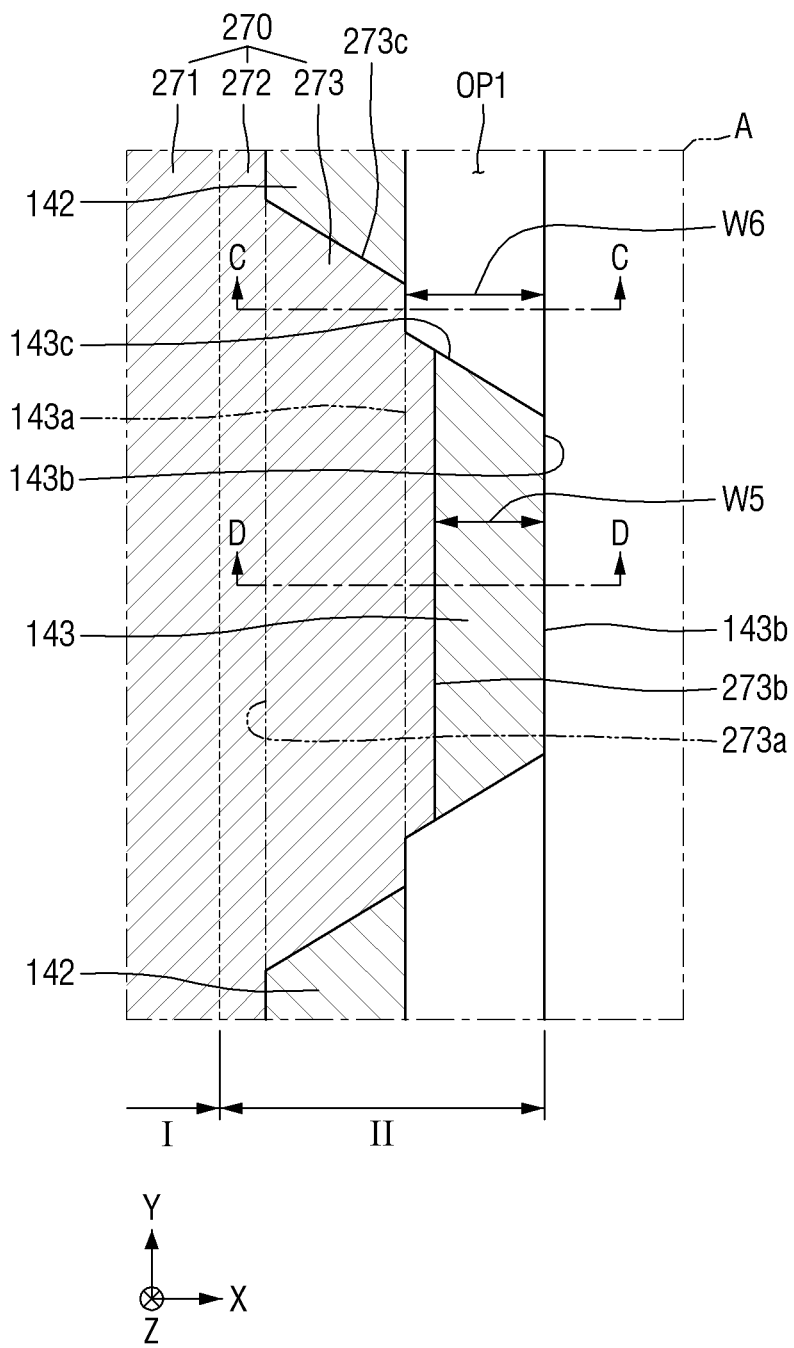
FIG. 13 is a top view provided to explain a semiconductor device according to some other exemplary embodiments.

FIG. 13 is a top view provided to explain a semiconductor device according to some other exemplary embodiments; FIG. 14 is a cross-sectional view provided to explain the semiconductor device illustrated in FIG. 13 according to some other exemplary embodiments; The base substrate 190 is excluded from FIG. 13 for convenience of explanation.

Figure 14:
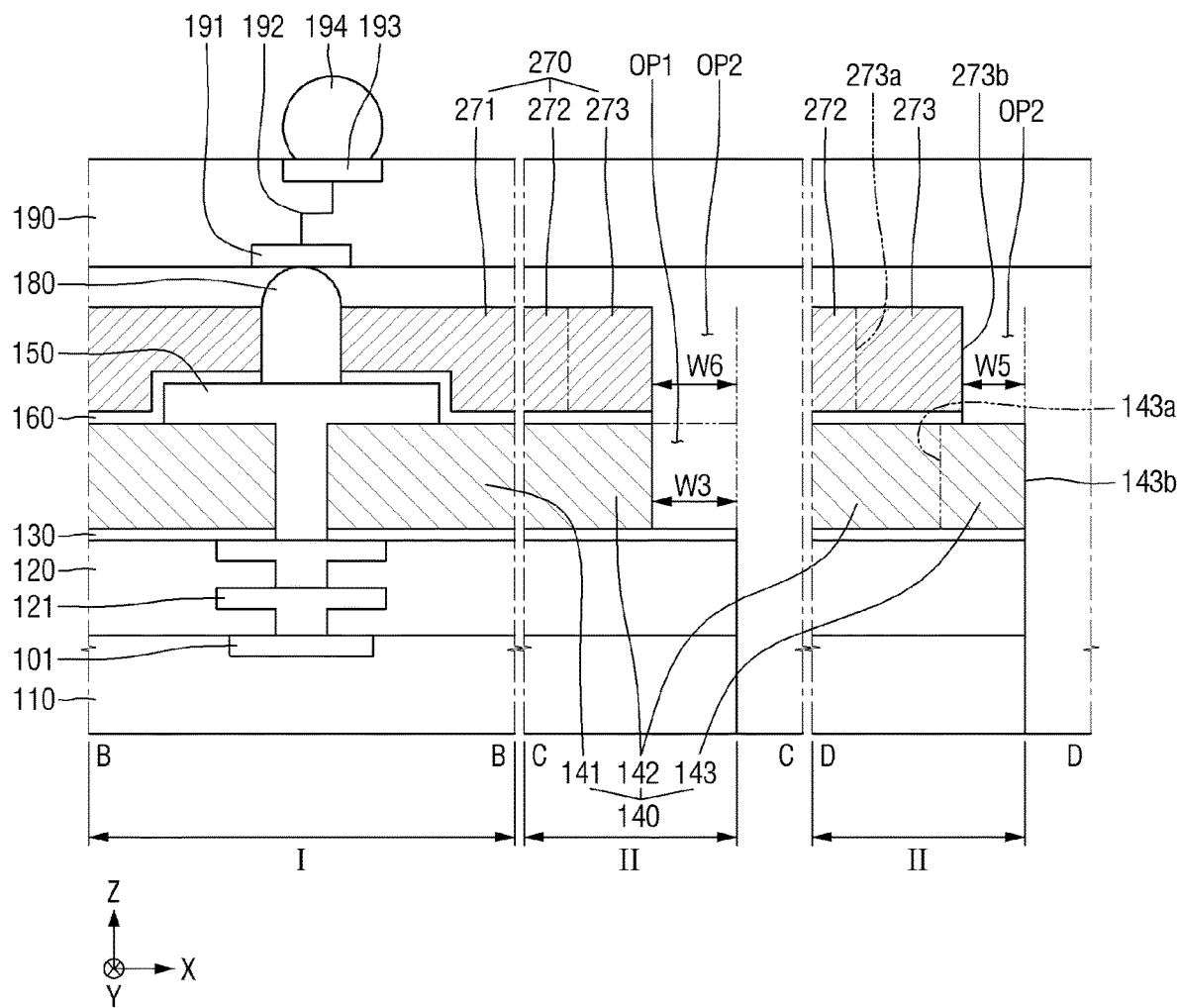
FIG. 14 is a cross-sectional view provided to explain the semiconductor device illustrated in FIG. 13 according to some other exemplary embodiments.

Referring to FIG. 13 and FIG. 14, a photo sensitive film 270 may include a fourth portion 271 disposed on the first portion 141 of the second insulating film 140, a fifth portion 272 disposed on the second portion 142 of the second insulating film 140 and connected with the fourth portion 271 of the photo sensitive film 270, and a sixth portion 273 protruded in the first direction X from the fifth portion 272 of the photo sensitive film 270.

The sixth portion 273 of the photo sensitive film 270 may include a fourth surface 273a in contact with the fifth portion 272 of the photo sensitive film 270, a fifth surface 273b opposing the fourth surface 273a, and a sixth surface 273c connecting the fourth surface 273a and the fifth surface 273b.

The sixth surface 273c of the sixth portion 273 of the photo sensitive film 270 may have a flat plane shape as illustrated in FIG. 13. A width in the second direction Y of the sixth portion 273 of the photo sensitive film 270 may decrease as a distance from the semiconductor chip region I increases.

However, the present disclosure is not limited thereto. That is, according to some other exemplary embodiments, the sixth surface 273c of the sixth portion 273 of the photo sensitive film 270 may have a curve plane shape.

At least part of the sixth portion 273 of the photo sensitive film 270 may be disposed on the third portion 143 of the second insulating film 140. That is, the fifth surface 273b of the sixth portion 273 of the photo sensitive film 270 may be formed between the first surface 143a of the third portion 143 of the second insulating film 140 and the second surface 143b of the third portion 143 of the second insulating film 140.

A width W5 in the first direction X between the fifth surface 273b of the sixth portion 273 of the photo sensitive film 270 and the second surface 143b of the third portion 143 of the second insulating film 140 may be formed to be smaller than a width W6 in the first direction X of the first open region OP1.

Referring to FIG. 14, at least part of the a sidewall of the second portion 142 of the second insulating film 140 exposed by the first open region OP1 and a sidewall of the sixth portion 273 of the photo sensitive film 270 exposed by the second open region OP2 may have a sequential slope profile.

Hereinbelow, a semiconductor device according to some other exemplary embodiments will be described with reference to FIG. 15. The difference from the semiconductor device illustrated in FIG. 2 will be highlighted.

Figure 15:
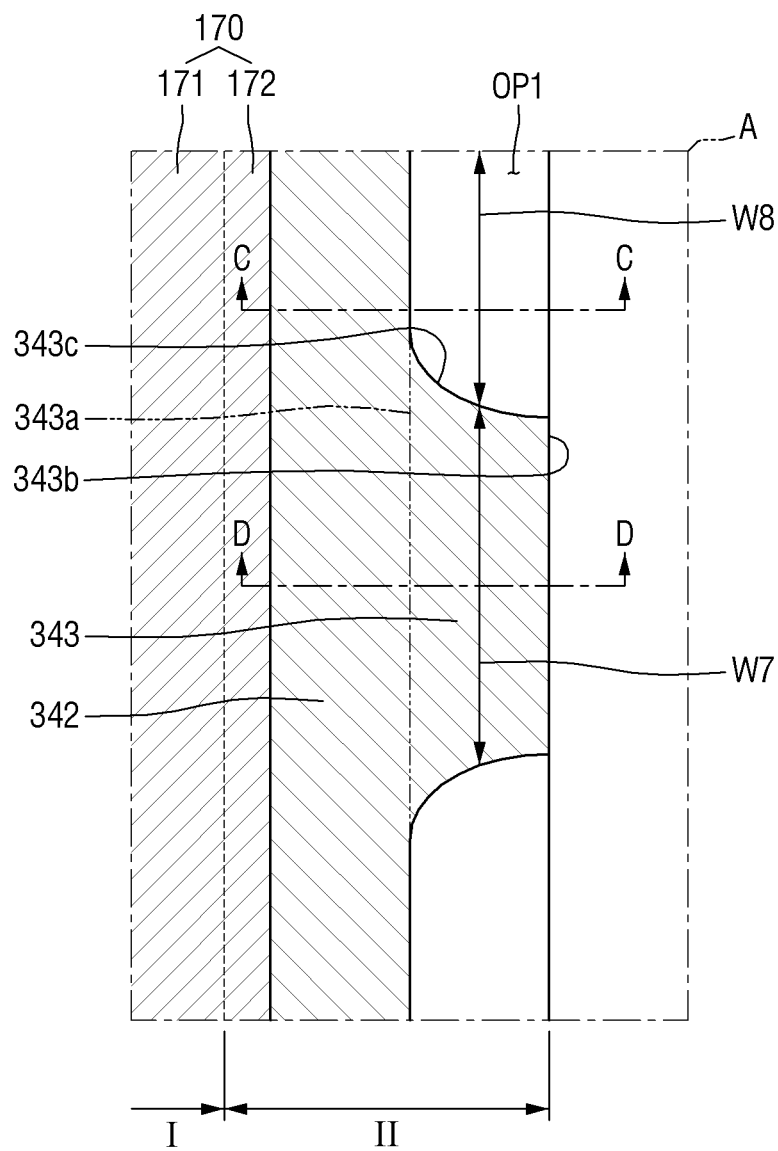
FIG. 15 is a top view provided to explain a semiconductor device according to some other exemplary embodiments.

FIG. 15 is a top view provided to explain a semiconductor device according to some other exemplary embodiments; The base substrate 190 is excluded from FIG. 15 for convenience of explanation.

Referring to FIG. 15, a second insulating film 340 may include a second portion 342 disposed on the scribe line region II and a third portion 343 connected with the second portion 342 in the first direction X.

The third portion 343 of the second insulating film 340 may include a first surface 343a in contact with the second portion 342 of the second insulating film 340, a second surface 343b opposed to the first surface 343a, and a third surface 343c connecting the first surface 343a and the second surface 343b.

In this case, the third surface 343c of the third portion 343 of the second insulating film 340 may have a curve plane shape indented in the third portion 343 of the second insulating film 340.

A width W7 in the second direction Y of the third portion 343 of the second insulating film 340 may decrease as a distance from the semiconductor chip region I increases. Further, a width W8 in the second direction Y of the first open region OP1 may increase as a distance from the semiconductor chip region I increases.

Hereinbelow, a semiconductor device according to some other exemplary embodiments will be described with reference to FIG. 16. The difference from the semiconductor device illustrated in FIG. 2 will be highlighted.

Figure 16:
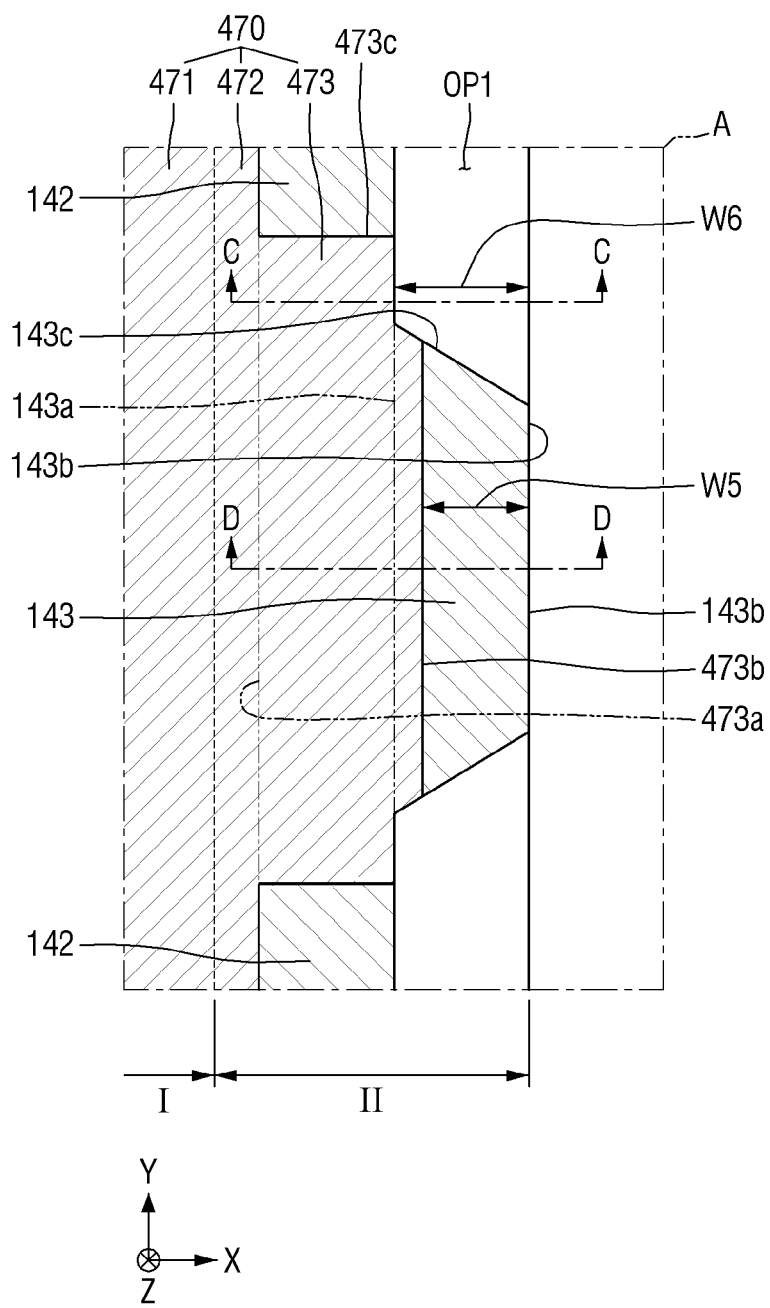
FIG. 16 is a top view provided to explain a semiconductor device according to some other exemplary embodiments.

FIG. 16 is a top view provided to explain a semiconductor device according to some other exemplary embodiments; The base substrate 190 is excluded from FIG. 16 for convenience of explanation.

Referring to FIG. 16, a photo sensitive film 470 may include a fourth portion 471 disposed on the first portion 141 of FIG. 3 of the second insulating film 140, a fifth portion 472 disposed on the second portion 142 of the second insulating film 140 and connected with the fourth portion 471 of the photo sensitive film 470, and a sixth portion 473 protruded in the first direction X from the fifth portion 472 of the photo sensitive film 470.

The sixth portion 473 of the photo sensitive film 470 may include a fourth surface 473a in contact with the fifth portion 472 of the photo sensitive film 470, a fifth surface 473b opposing the fourth surface 473a, and a sixth surface 473c connecting the fourth surface 473a and the fifth surface 473b.

The sixth surface 473c of the sixth portion 473 of the photo sensitive film 470 may have a flat plane shape as illustrated in FIG. 16. A width in the second direction Y of the sixth portion 473 of the photo sensitive film 470 may be formed to be regular along the first direction X.

At least part of the sixth portion 473 of the photo sensitive film 470 may be disposed on the third portion 143 of the second insulating film 140. That is, the fifth surface 473b of the sixth portion 473 of the photo sensitive film 470 may be formed between the first surface 143a of the third portion 143 of the second insulating film 140 and the second surface 143b of the third portion 143 of the second insulating film 140.

A width W5 in the first direction X between the fifth surface 473b of the sixth portion 473 of the photo sensitive film 470 and the second surface 143b of the third portion 143 of the second insulating film 140 may be formed to be smaller than a width W6 in the first direction X of the first open region OP1.

At least part of a sidewall of the second portion 142 of the second insulating film 140 exposed by the first open region OP1 and a sidewall of the sixth portion 473 of the photo sensitive film 470 exposed by the second open region OP2 may have a sequential slope profile.

Hereinbelow, a semiconductor device according to some other exemplary embodiments will be described with reference to FIG. 17 and FIG. 18. The difference from the semiconductor devices illustrated in FIG. 2 and FIG. 3 will be highlighted.

Figure 17:
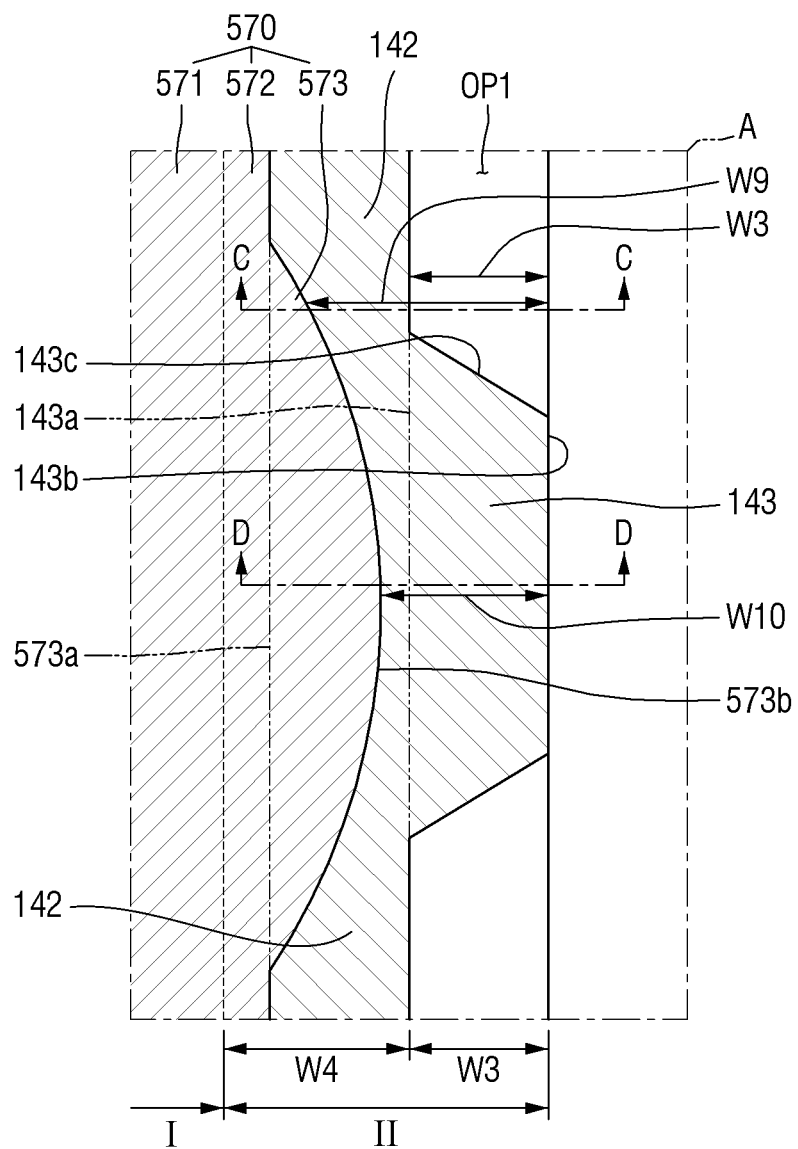
FIG. 17 is a top view provided to explain a semiconductor device according to some other exemplary embodiments.

FIG. 17 is a top view provided to explain a semiconductor device according to some other exemplary embodiments; FIG. 18 is a cross-sectional view provided to explain the semiconductor device illustrated in FIG. 17 according to some other exemplary embodiments; The base substrate 190 is excluded from FIG. 17 for convenience of explanation.

Figure 18:
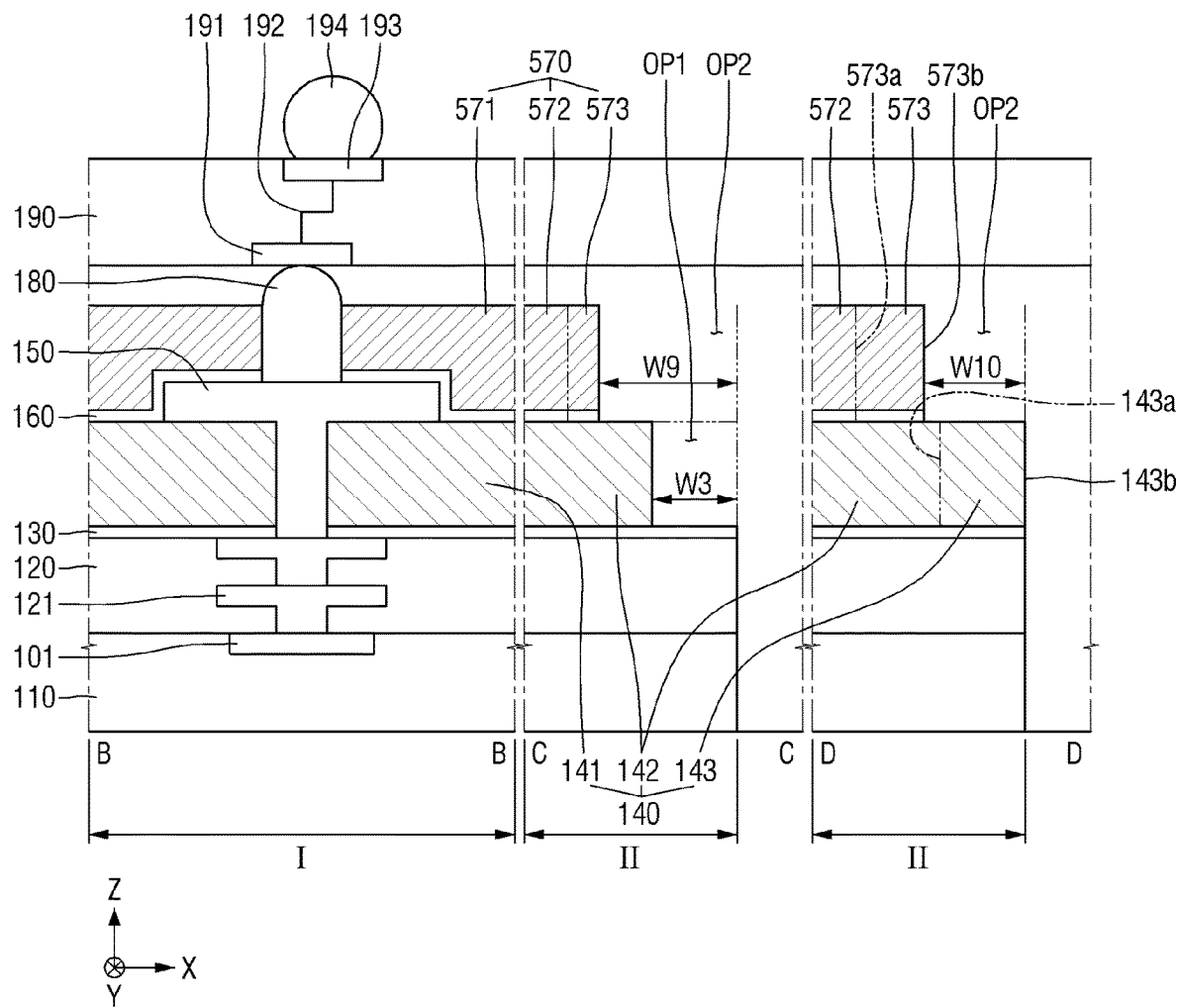
FIG. 18 is a cross-sectional view provided to explain the semiconductor device illustrated in FIG. 17 according to some other exemplary embodiments.

Referring to FIG. 17 and FIG. 18, a photo sensitive film 570 may include a fourth portion 571 disposed on the first portion 141 of the second insulating film 140, a fifth portion 572 disposed on the second portion 142 of the second insulating film 140 and connected with the fourth portion 571 of the photo sensitive film 570, and a sixth portion 573 protruded in the first direction X from the fifth portion 572 of the photo sensitive film 570.

The sixth portion 573 of the photo sensitive film 570 may include a fourth surface 573a in contact with the fifth portion 572 of the photo sensitive film 570 and a fifth surface 573b connected with the fourth surface 573a.

The fifth surface 573b of the sixth portion 573 of the photo sensitive film 570 may have a flat plane shape as illustrated in FIG. 17. A width in the second direction Y of the sixth portion 573 of the photo sensitive film 570 may decrease as a distance from the semiconductor chip region I increases.

The sixth portion 573 of the photo sensitive film 570 may be formed only on the second portion 142 of the second insulating film 140. That is, the sixth portion 573 of the photo sensitive film 570 does not overlap the third portion 143 of the second insulating film 140.

The fifth surface 573b of the sixth portion 573 of the photo sensitive film 570 may be formed between the first surface 143a of the third portion 143 of the second insulating film 140 and the fourth surface 573a of the sixth portion 573 of the photo sensitive film 570.

Widths W9, W10 in the first direction X between the fifth surface 573b of the sixth portion 573 of the photo sensitive film 570 and the second surface 143b of the third portion 143 of the second insulating film 140 may be formed to be greater than the width W3 in the first direction X of the first open region OP1.

Hereinbelow, a semiconductor device according to some other exemplary embodiments will be described with reference to FIG. 19 and FIG. 20. The difference from the semiconductor devices illustrated in FIG. 2 and FIG. 3 will be highlighted.

Figure 19:
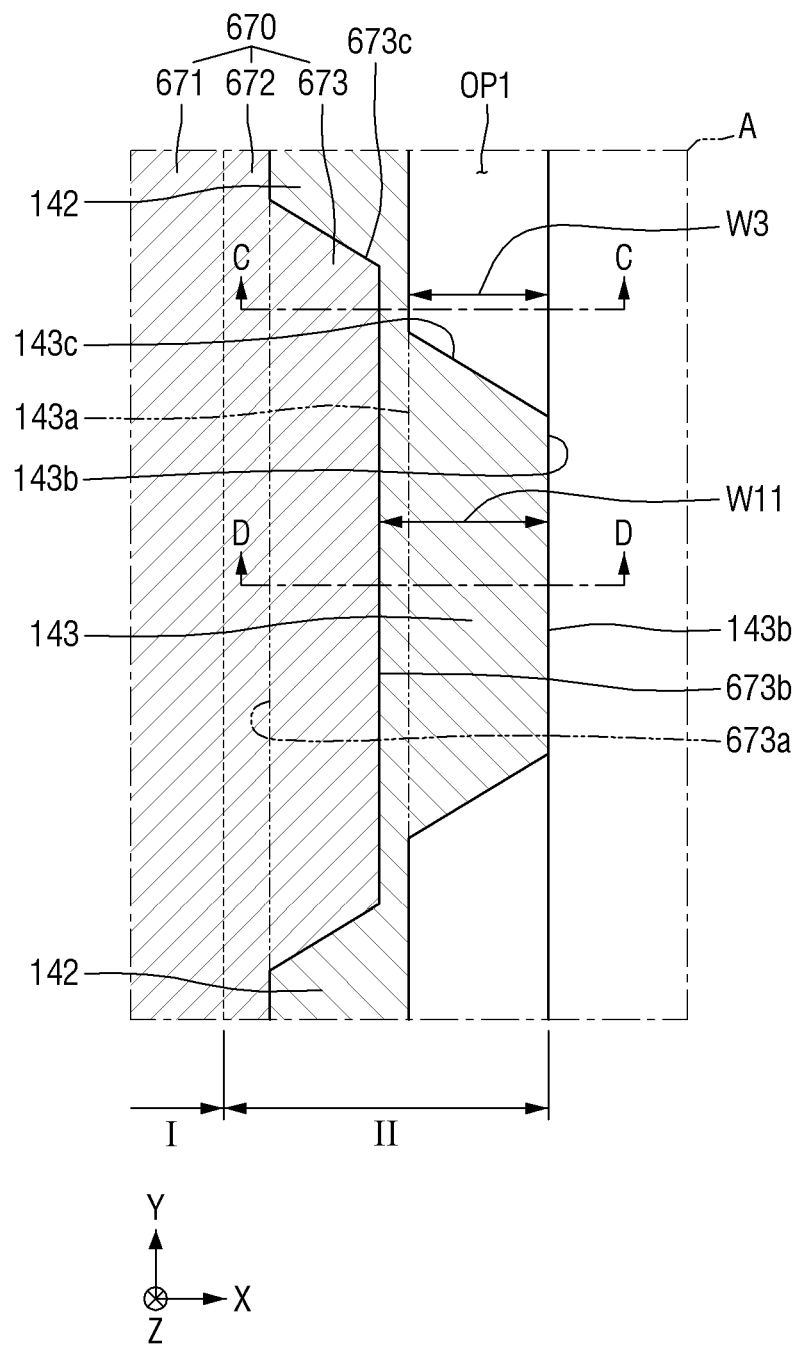
FIG. 19 is a top view provided to explain a semiconductor device according to some other exemplary embodiments.

FIG. 19 is a top view provided to explain a semiconductor device according to some other exemplary embodiments; FIG. 20 is a cross-sectional view provided to explain the semiconductor device illustrated in FIG. 19 according to some other exemplary embodiments; The base substrate 190 is excluded from FIG. 19 for convenience of explanation.

Figure 20:
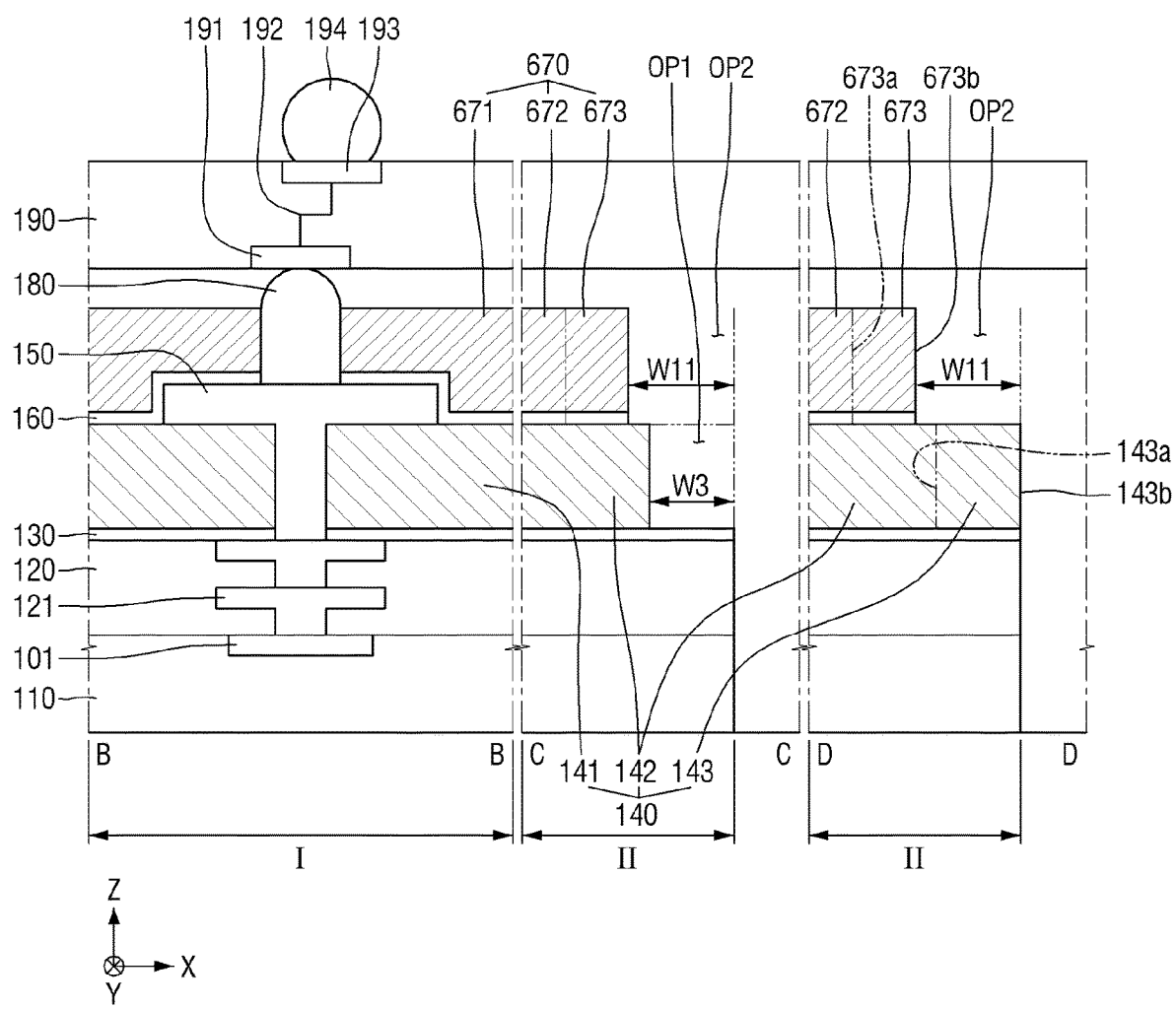
FIG. 20 is a cross-sectional view provided to explain the semiconductor device illustrated in FIG. 19 according to some other exemplary embodiments.

Referring to FIG. 19 and FIG. 20, a photo sensitive film 670 may include a fourth portion 671 disposed on the first portion 141 of the second insulating film 140, a fifth portion 672 disposed on the second portion 142 of the second insulating film 140 and connected with the fourth portion 671 of the photo sensitive film 670, and a sixth portion 673 protruded in the first direction X from the fifth portion 672 of the photo sensitive film 670.

The sixth portion 673 of the photo sensitive film 670 may include a fourth surface 673a in contact with the fifth portion 672 of the photo sensitive film 670, a fifth surface 673b opposing the fourth surface 673a, and a sixth surface 673c connecting the fourth surface 673a and the fifth surface 673b.

The sixth surface 673c of the sixth portion 673 of the photo sensitive film 670 may have a flat plane shape as illustrated in FIG. 19. A width in the second direction Y of the sixth portion 673 of the photo sensitive film 670 may decrease as a distance from the semiconductor chip region I increases.

However, the present disclosure is not limited thereto. That is, according to some other exemplary embodiments, the sixth surface 673c of the sixth portion 673 of the photo sensitive film 670 may have a curve plane shape.

The sixth portion 673 of the photo sensitive film 670 may be formed only on the second portion 142 of the second insulating film 140. That is, the sixth portion 673 of the photo sensitive film 670 does not overlap the third portion 143 of the second insulating film 140.

The fifth surface 673b of the sixth portion 673 of the photo sensitive film 670 may be formed between the first surface 143a of the third portion 143 of the second insulating film 140 and the fourth surface 673a of the sixth portion 673 of the photo sensitive film 670.

A width W11 in the first direction X between the fifth surface 673b of the sixth portion 673 of the photo sensitive film 670 and the second surface 143b of the third portion 143 of the second insulating film 140 may be formed to be greater than the width W3 in the first direction X of the first open region OP1.

Exemplary embodiments according to the present disclosure are explained hereinabove with reference to the drawings attached, but it should be understood that the present disclosure is not limited to the aforementioned exemplary embodiments, but may be fabricated in various different forms, and may be implemented by a person skilled in the art in other specific forms without altering the technical concept or characteristics of the present disclosure. Accordingly, it will be understood that the exemplary embodiments described above are only illustrative, and should not be construed as limiting.

What is claimed is:

1. A semiconductor device comprising:
a substrate comprising a semiconductor chip region and a scribe line region disposed along an edge of the semiconductor chip region;
an insulating film comprising a first portion disposed on the semiconductor chip region, a second portion disposed on the scribe line region and connected with the first portion, and a third portion disposed on the scribe line region and protruded in a first direction from the second portion; and
a photo sensitive film disposed on the insulating film and having an exposed sidewall exposed on the second portion of the insulating film,
wherein a first width of the third portion in a second direction perpendicular to the first direction decreases as a distance from the semiconductor chip region increases, and
wherein a sidewall of the third portion in the first direction is coplanar with a sidewall of the substrate in the first direction.

2. The semiconductor device of claim 1, wherein the third portion comprises a first surface in contact with the second portion, a second surface opposing the first surface, and a third surface connecting the first surface and the second surface, and
the third surface has a flat plane shape.

3. The semiconductor device of claim 1, wherein the photo sensitive film comprises a fourth portion disposed on the first portion of the insulating film, a fifth portion disposed on the second portion of the insulating film, and a sixth portion protruded in the first direction from the fifth portion.

4. The semiconductor device of claim 3, wherein the sixth portion comprises a fourth surface in contact with the fifth portion, a fifth surface opposing the fourth surface, and a sixth surface connecting the fourth surface and the fifth surface, and
the sixth surface has a flat plane shape.

5. The semiconductor device of claim 4, wherein a second width in the second direction of the sixth portion decreases as a distance from the semiconductor chip region increases.

6. The semiconductor device of claim 4, wherein the fifth surface is formed between a first surface of the third portion that is in contact with the second portion of the insulating film, and a second surface of the third portion that opposes the first surface.

7. The semiconductor device of claim 4, wherein the fifth surface is formed between a first surface of the third portion that is in contact with the second portion, and the fourth surface.

8. The semiconductor device of claim 3, wherein the sixth portion comprises a fourth surface in contact with the fifth portion, and a fifth surface connected with the fourth surface, and
the fifth surface has a curve plane shape.

9. The semiconductor device of claim 1, wherein the third portion comprises a first surface in contact with the second portion, and a second surface connected with the first surface, and
the second surface has a curve plane shape.

10. The semiconductor device of claim 1, wherein the exposed sidewall of the photo sensitive film extends in the second direction.

11. The semiconductor device of claim 1, further comprising a base substrate disposed on the photo sensitive film.

12. A semiconductor device, comprising:
a substrate comprising a semiconductor chip region and a scribe line region disposed along an edge of the semiconductor chip region;
an insulating film comprising a first portion disposed on the semiconductor chip region, a second portion disposed on the scribe line region and connected with the first portion, and a third portion disposed on the scribe line region and protruded in a first direction from the second portion;
a first open region defined by a first sidewall of the second portion and a second sidewall of the third portion on the scribe line region;
a photo sensitive film disposed on the insulating film and having an exposed sidewall exposed on the second portion; and
a second open region defined by the insulating film and the exposed sidewall of the photo sensitive film on the first open region,
wherein a first width in a second direction perpendicular to the first direction of the first open region increases as a distance from the semiconductor chip region increases, and
wherein a sidewall of the third portion in the first direction is coplanar with a sidewall of the substrate in the first direction.

13. The semiconductor device of claim 12, wherein a second width in the first direction of the second open region is formed to be regular along the second direction.

14. The semiconductor device of claim 12, wherein the photo sensitive film comprises a fourth portion disposed on the first portion of the insulating film, a fifth portion disposed on the second portion of the insulating film, and a sixth portion protruded in the first direction from the fifth portion.

15. The semiconductor device of claim 12, wherein at least part of a third sidewall of the insulating film exposed by the first open region and at least part of the exposed sidewall of the photo sensitive film exposed by the second open region have sequential slope profiles.

16. The semiconductor device of claim 12, further comprising a passivation film disposed between the insulating film and the photo sensitive film.

17. A semiconductor device, comprising:
a substrate comprising a semiconductor chip region and a scribe line region disposed along an edge of the semiconductor chip region;
an insulating film comprising a first portion disposed on the semiconductor chip region, a second portion disposed on the scribe line region and connected with the first portion, and a third portion disposed on the scribe line region and protruded in a first direction from the second portion;
a photo sensitive film comprising a fourth portion disposed on the first portion of the insulating film, a fifth portion disposed on the second portion of the insulating film, and a sixth portion protruded in the first direction from the fifth portion; and
a base substrate disposed on the photo sensitive film,
wherein a first width of the third portion in a second direction perpendicular to the first direction decreases as a distance from the semiconductor chip region increases.

18. The semiconductor device of claim 17, wherein at least part of the sixth portion is disposed on the third portion of the insulating film.

19. The semiconductor device of claim 17, wherein a second width in the second direction of the sixth portion decreases as a distance from the semiconductor chip region increases.

20. The semiconductor device of claim 17, wherein the sixth portion does not overlap the third portion.

* * * * *